(12) United States Patent
Kikutake et al.

(10) Patent No.: US 6,226,203 B1
(45) Date of Patent: May 1, 2001

(54) MEMORY DEVICE

(75) Inventors: Akira Kikutake; Masato Matsumiya; Satoshi Eto; Kuninori Kawabata, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/502,470

(22) Filed: Feb. 11, 2000

(30) Foreign Application Priority Data

Apr. 30, 1999 (JP) .................................................. 11-124284

(51) Int. Cl.[7] ...................................................... G11C 7/00
(52) U.S. Cl. ............................... 365/189.01; 365/189.03; 365/189.04; 365/189.05; 365/205
(58) Field of Search ........................ 365/189.01, 189.03, 365/189.04, 189.05, 205

(56) References Cited

U.S. PATENT DOCUMENTS 5,774,702 * 6/1998 Mitsuishi et al. ..................... 395/556
5,857,083 * 1/1999 Venkat ................................. 395/309

FOREIGN PATENT DOCUMENTS

357045643 * 3/1982 (JP) .
363146148 * 6/1988 (JP) .

* cited by examiner

Primary Examiner—Viet Q. Nguyen
(74) Attorney, Agent, or Firm—Arent Fox Kintner Plotkin & Kahn, PLLC (57) ABSTRACT

It is one aspect of the present invention to split a common data bus established in common for a plurality of segments into a read-dedicated common data bus and a write dedicated common data bus, in a memory device comprising a plurality of segments each of which includes a plurality of memory cells. With such a constitution, write data can be supplied to the write data bus even when read data are present on the read common data bus due to a read operation; and even when operation frequencies increase, there are no limitations to the timing of write operations following reading and the speed of write operations following reading can be increased.

9 Claims, 11 Drawing Sheets

MEMORY DEVICE

BACKGROUND OF THE INVENTION

1. Field of the Invention

The present invention relates to a memory device such as DRAM, and more particularly to a memory device comprising a common data bus for a plurality of segments that increases the speed of write operations following reading or prevents reductions in reading speed due to noise during reading.

2. Description of the Related Art

Synchronous dynamic RAM (SDRAM) and the like are noteworthy as high speed DRAM. Increasing reading speeds is a very important requirement for such high speed DRAM. Also, it is necessary to increase the speed of write operations following read operations. The latest memory devices are not just individual memory devices; these new memory devices are proposed for the purposes of "RAM and logic" devices which are joined to logic circuits. Consequently the memory device disclosed in this specification may also be applied to such RAM and logic devices.

Figure 1:
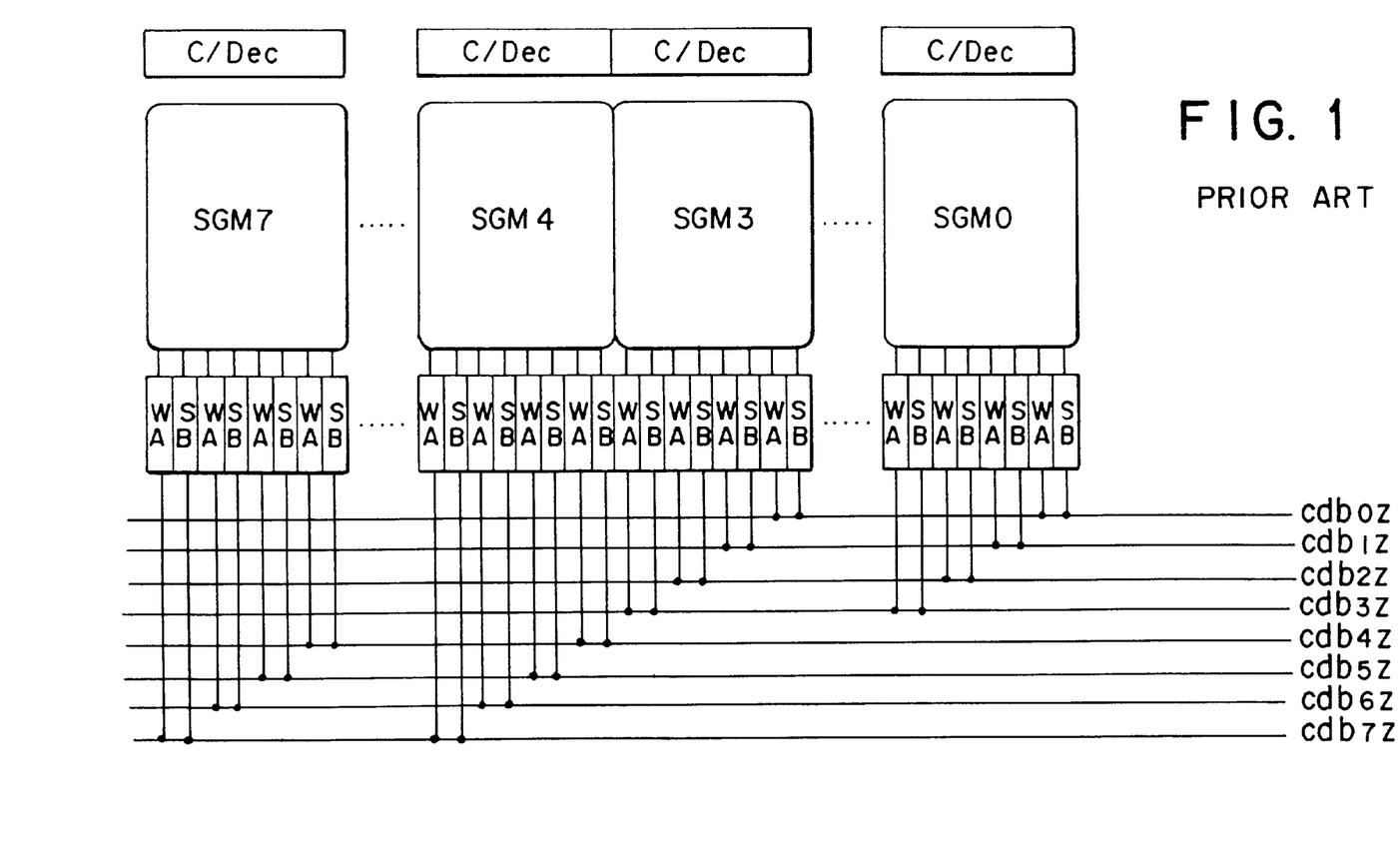
FIG. 1 shows the constitution of a conventional memory device.

FIG. 1 shows the constitution of a conventional memory device. The memory device shown in FIG. 1 comprises eight segments SGM0~7. Each of the segments comprises a plurality of memory cells and sense amps; each segment includes a column decoder C/Dec and four groups of read sense buffers SB and write amps WA. Within each segment, the abovementioned four groups of sense buffers SB and write amps WA are connected to four groups of memory cells selected with the column decoder C/Dec.

The four groups of sense buffers SB and write amps WA in segments SGM0~3 are connected to the common data bus cdb0z~cdb3z, respectively, established in common for the four segments. The four groups of sense buffers SB and write amps WA in segments SGM4~7 are likewise connected to the common data bus cdb4z~cdb7z established in common for the four segments. The sense buffer SB or write amp WA of one of the segments SGM0~3 is activated and read data are output to the common data bus cdb0z~cdb3z or write data are supplied to the common data bus from a data input circuit, not shown. This is the same for segments SGM4~7.

The eight common data buses cdb0z~cdb7z are each connected to eight groups of data input circuits and data output circuits, not shown. Those data input circuits and output circuits are each connected to data input/output terminals (DQ terminals). Specifically, in the example in FIG. 1, 8 bits of data are output simultaneously in a read operation and 8 bits of data are input simultaneously in a write operation.

In a conventional memory device, there is a margin of time between the read operations and write operations; consequently, the common data buses established in common for a plurality of segments are used for both reading and writing.

However, further improvements are necessary in order to meet the requirements of higher speed memory devices. For example, when performing a write operation after reading, it is required that the write operation be at high speeds. Furthermore, disruption of the waveform due to coupling noise between data buses during reading sometimes causes reductions in reading speeds.

Figure 2A:
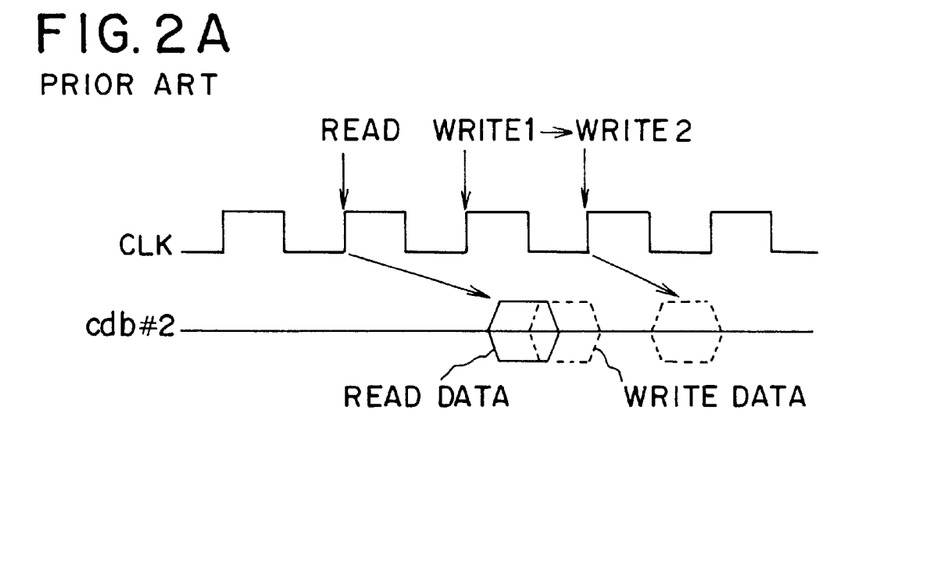
FIGS. 2A and 2B are timing charts for explaining the problems with the prior art.
Figure 2B:
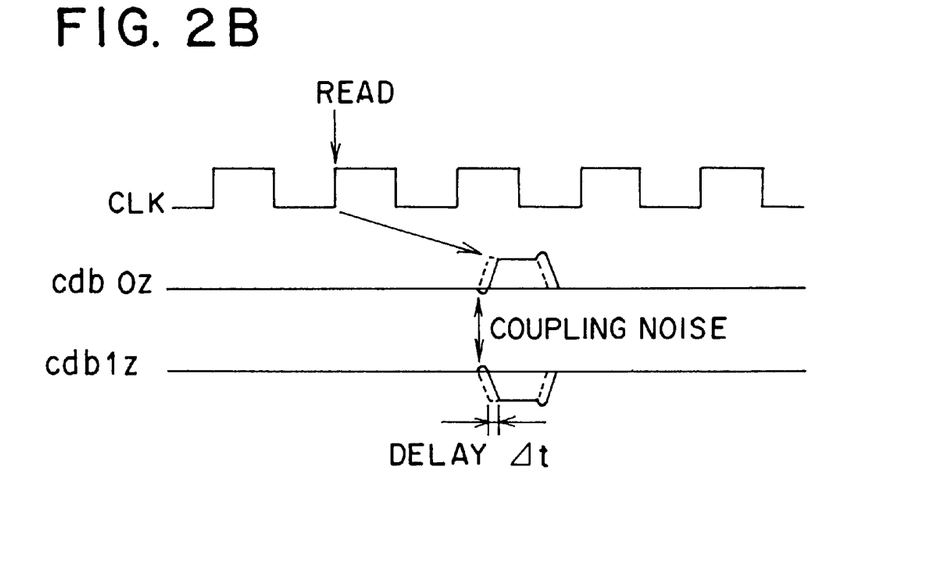

FIG. 2 is a timing chart for explaining the problems with the prior art. FIG. 2A shows the common data bus cdb#z in the case of a write command Write provided following a read command Read. In the case of synchronous DRAM (SDRAM), the control commands are supplied in synchronization with the leading edge of the clock CLK. In a usual read operation, an active command Active, not shown, is supplied; in response thereto, a wordline is driven, a sense amp is driven, and the voltage of the bitline is increased. After that, when a read command Read is supplied in synchronization with the leading edge of the clock CLK, the sense buffer SB is activated and the common data bus cdb#z connected thereto is driven according to the read data.

In FIG. 2A, once the read command Read is supplied, the common data bus cdb#z is driven and read data are output after one clock and read data are output to the data input/output terminal DQ, not shown, after two clocks. Specifically, the CAS latency, being the number of clocks from when the read command is input until data are output to the data input/output terminal DQ, is set to two.

However, when a write command Write1 is supplied at the leading edge of the clock CLK directly following the read operation and at the same time, write data are supplied to the data input/output terminal DQ, not shown, the write data may be supplied to the common data bus cdb#z and cause an erroneous operation where read data are still being output to the common data bus cdb#z. In particular, a fight between the read data and write data on the abovementioned common data bus occurs when the operation frequency is increased by raising the frequency of the synchronizing clock CLK. Such a data conflict is thought to result from the difference between the time it takes for read data to move from the sense amp in the segment to the common data bus cdb#z, and the time it takes for write data to move from the data input/output terminal to the common data bus cdb#z. Consequently, in conventional memory devices, a write command following a read operation, like Write2 in the figure, must be delayed by one clock.

Furthermore, FIG. 2B shows the decrease in reading speed due to coupling noise when the common data bus is driven in response to a read command. As shown in FIG. 1, the eight common data buses cdb#z are established beside each other. Consequently, when mutually different read data are supplied with the same timing to adjacent common data buses cdb0z, cdb1z by the sense buffers SB, it is sometimes the case that the level of the common data bus cdb0z, which is driven High, temporarily drops due to the coupling influence from the adjacent common data bus cdb1z which is driven Low and the time necessary for reaching the High level is delayed (Δt in the figure). At the same time, the level of the common data bus cdb1z which is driven Low temporarily rises due to the coupling influence from the adjacent common data bus cdb0z which is driven High, and the time necessary for reaching the Low level is delayed.

This read data delay Δt due to the coupling noise is a delay that brings about decreases in reading speeds overall, and in particular, should be prevented in order to keep the time until the read data are output within the catalog-specified values at high speed clocks CLK.

SUMMARY OF THE INVENTION

It is an object of the present invention to provide a memory device which can increase the speed of write operations after reading or during reading.

It is a further object of the present invention to provide a memory device which can raise reading speeds.

It is a further object of the present invention to provide a memory device comprising a new common data bus structure.

In order to achieve the abovementioned objects, it is a first aspect of the present invention to split a common data bus established in common for a plurality of segments into a read-dedicated common data bus and a write dedicated common data bus, in a memory device comprising a plurality of segments each of which includes a plurality of memory cells. With such a constitution, write data can be supplied to the write data bus even when read data are present on the read common data bus due to a read operation; and even when operation frequencies increase, there are no limitations to the timing of write operations following reading and the speed of write operations following reading can be increased.

In order to achieve the abovementioned objects, it is a second aspect of the present invention to split a common data bus into a read-dedicated common data bus and a write-dedicated common data bus as above, while alternately establishing the read common data bus and write common data bus. With such a constitution, a write common data bus is established between adjacent read common data buses and coupling noise due to the inverse read data is minimized even when different data are supplied on adjacent read common data buses. As a result, reductions in reading speed can be prevented.

In order to achieve the abovementioned objects, a further invention is a memory device, having a plurality of segments each of which includes a plurality of memory cells, comprising: a sense buffer for inputting read data from said segment and a write amp for supplying write data to said segment, said sense buffer and write amp being established for each of said segments; a common data bus group including a read common data bus established in common for said sense buffers of said plurality of segments and a write common data bus established in common for said write amps of said plurality of segments; and a data input/output circuit for outputting the read data from said read common data bus and supplying the write data to said write common data bus.

In order to achieve the abovementioned objects, the present invention is a memory device, having a plurality of segments each of which includes a plurality of memory cells, comprising: read data bus lines and write data bus lines, separately established in a path from bitlines connecting to said memory cells to the data input/output terminal; a sense buffer for transferring read data within said separate read data bus; and a write amp for transferring write data within said separate write data bus.

DESCRIPTION OF THE PREFERRED EMBODIMENTS

The preferred embodiments of the present invention are explained below with reference to the drawings. Such embodiments do not limit the technical scope of the present invention.

Figure 3:
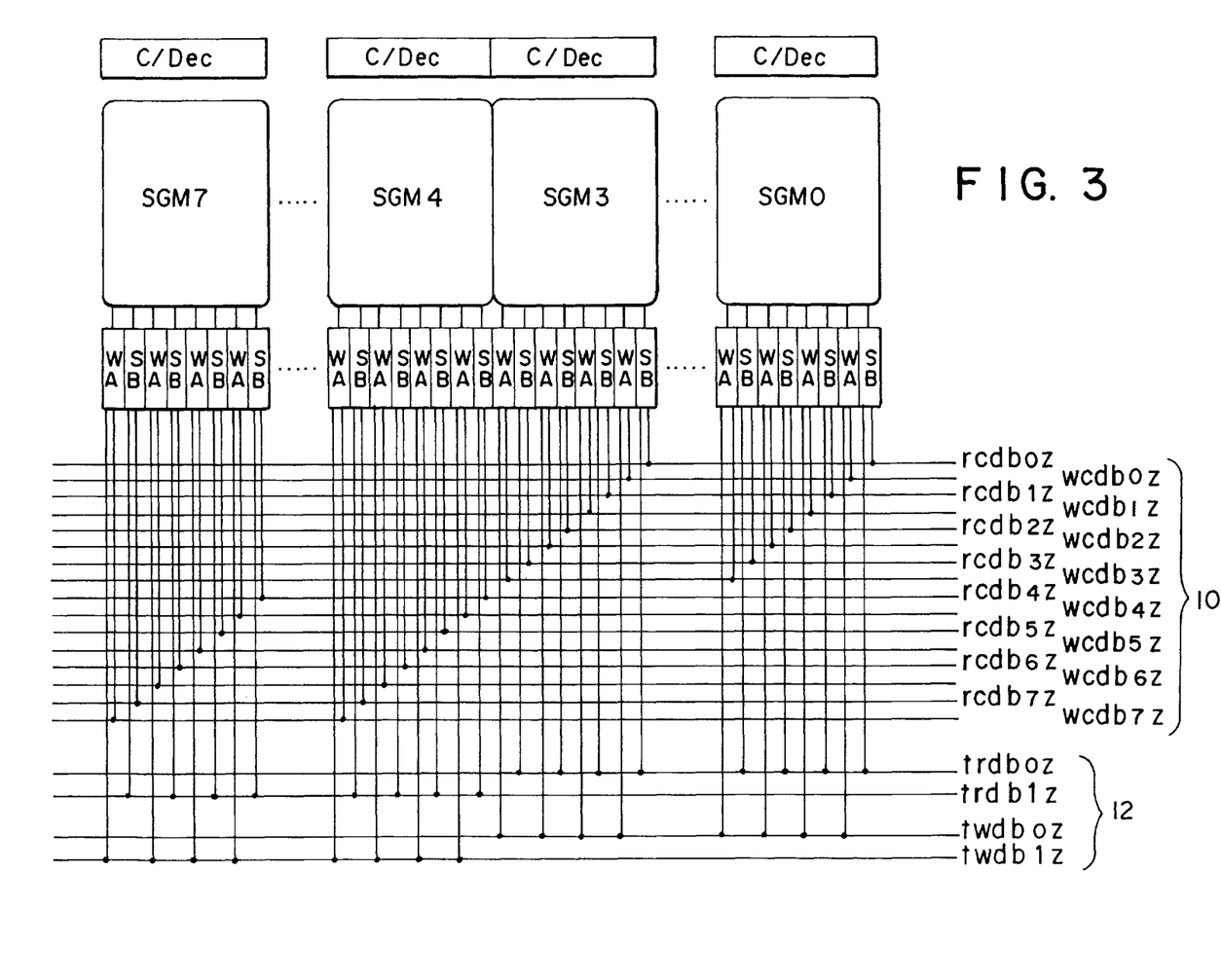
FIG. 3 shows the constitution of the memory device in the embodiments.

FIG. 3 shows the constitution of a memory device relating to the present embodiment. The memory device in FIG. 3 comprises eight segments SGM0~7 like that in FIG. 1; as discussed below, a plurality of memory cells and sense amps are established within each segment SGM0~7. Also, a column decoder C/Dec and four groups of read sense buffers SB and write amps WA are established for each segment.

The common data bus group 10 established in common for the plurality of segments comprises read-dedicated common data buses rcdb0z~rcdb7z and write-dedicated common data buses wcdb0z~wcdb7z. Moreover, those read common data buses rcdb0z~rcdb7z and write common data buses wcdb0z~wcdb7z are established alternately and parallel to each other; a write common data bus is established between read common data buses.

The read-dedicated data buses rcdb0z~rcdb3z are connected in common to the four sense buffers SB of the segments SGM0~3; the read-dedicated data buses rcdb4z~rcdb7z are connected in common to the four sense buffers SB of the segments SGM4~7. Also, the write common data buses wcdb0z~wcdb3z are connected in common to the four write amps WA of the segments SGM0~3; the write common data buses wcdb4z~wcdb7z are connected in common to the four write amps WA of the segments SGM4~7.

The separately established read common data buses and write common data buses are connected via their respective output circuits and input circuits to the common data input/output terminal DQ, not shown.

In FIG. 3, a test data bus group 12, comprising test read data buses trdb0z, trdb1z and test write data buses twdb0z and twdb1z, is established in addition to the common data bus group 10. The test read data bus trdb0z is connected in common to a total of 16 sense buffers SB, four within each of segments SGM0~3. Likewise, the test read data bus trdb1z is connected in common to a total of 16 sense buffers SB in segments SGM4~7. Likewise, the test write data bus twdb0z is connected in common to a total of 16 write amps WA in segments SGM0~3; and the test write data bus twdb1z is connected in common to a total of 16 write amps WA in segments SGM4~7.

The test data buses are used when testing the reading and writing of data in four segments at the same time. The test time can be reduced by testing four segments at the same time.

Figure 4A:
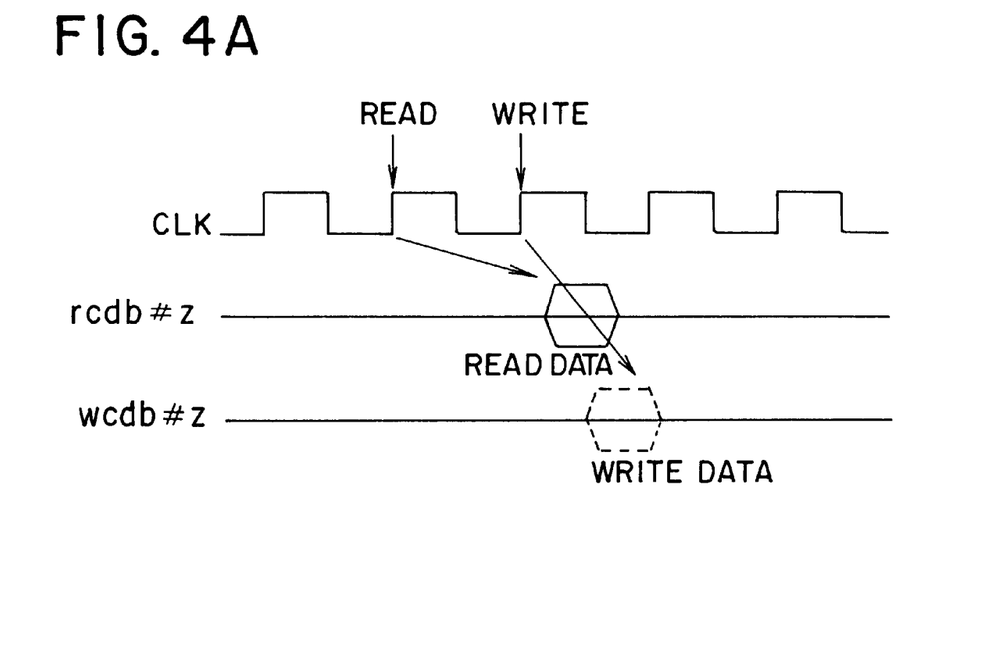
FIGS. 4A and 4B are operations timing charts for the memory device in FIG. 3.
Figure 4B:
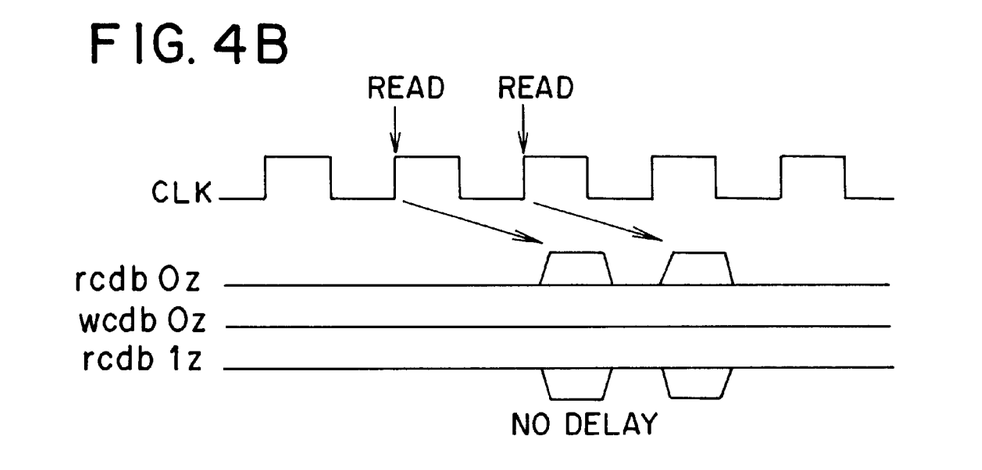

FIG. 4 shows an operations timing chart for the memory device in FIG. 3. FIG. 4 corresponds to FIG. 2 for the background art. FIG. 4A shows a write operation following reading. The read command Read is supplied in synchronization with the leading edge of the synchronizing clock CLK; in the next clock CLK cycle, the sense buffer SB outputs the read data to the read common data bus rcdb#z. Then a write command Write is supplied in synchronization with the leading edge of the next clock after the read command Read is supplied; the write data supplied at the same time is supplied to the write common data bus wcdb#z within the same clock cycle. In that case, even if the timing in which the read data and write data are supplied to the common data bus are very close, there is no conflict between the read data and write data on the same common data bus because both common data buses rcdb#z and wcdb#z are separated.

Consequently, even when the clock CLK frequency is increased and high speed operations performed, the write command Write can be provided and a write operation can be performed following reading according to the read command and without limitations such as a one clock delay.

Furthermore, FIG. 4B shows a read operation. Even when mutually reverse-phased read data are supplied to the adjacent read common data buses rcdb0z and rcdb1z at the same time in response to the read command Read, the write common data bus wcdb0z established therebetween has a shielding function and there is no coupling noise between the adjacent read common data buses rcdb0z and rcdb1z. Consequently, in comparison to FIG. 2, the read data corresponding to each read command Read are supplied without delays to the read common data buses. Consequently, the time from the read command until the output of the read data can be kept to within the time stipulated in the catalog.

In FIG. 4B, furthermore, the read commands Read are supplied sequentially in synchronization with the leading edge of the clock CLK. In that case, the read data corresponding to each read command Read must be generated within the next clock cycle on the read common data bus. Because there is no delay as in FIG. 2, the read data are each definitely supplied within the next clock cycle and read data can be output sequentially in response to sequential read commands. Furthermore, even when the synchronizing clock CLK frequency becomes high, read data can be sequentially output to the read common data buses because there is no delay of the read data. Burst read operations synchronized with a high speed clock CLK become possible, for example.

Figure 5:
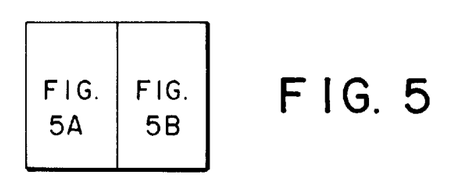
FIG. 5 shows the constitution of the memory device in the embodiments in greater detail.
Figure 5A:
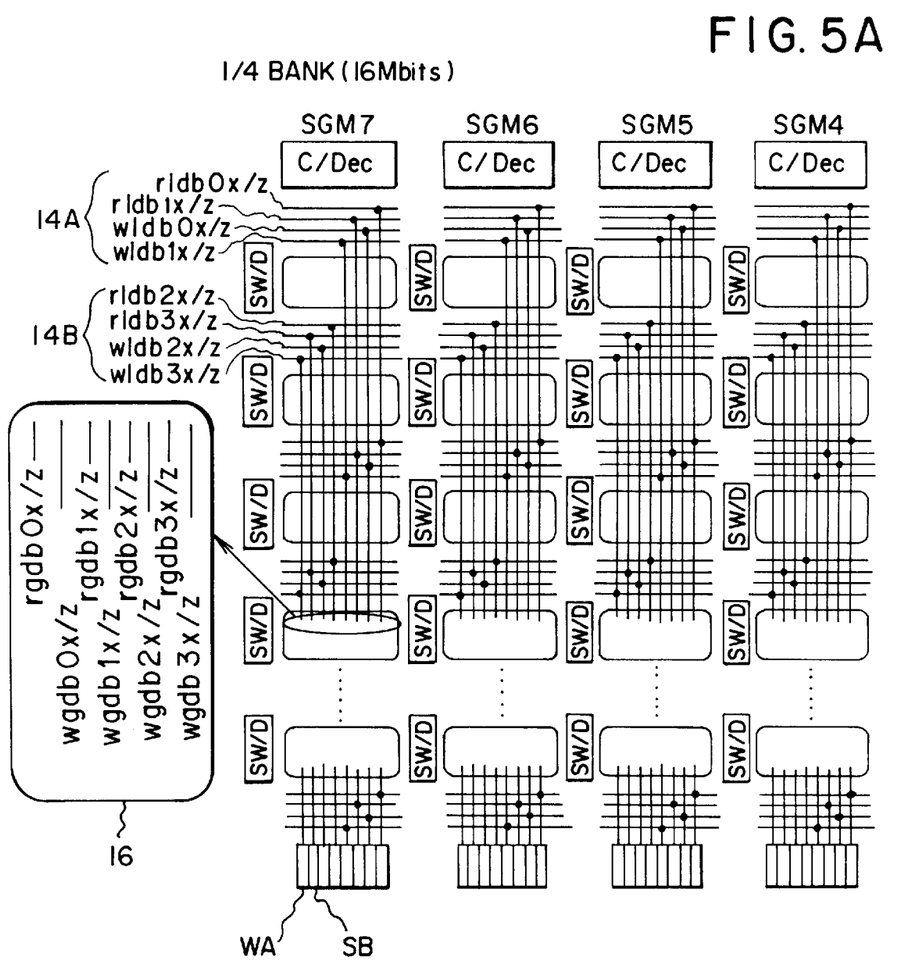
Figure 5B:
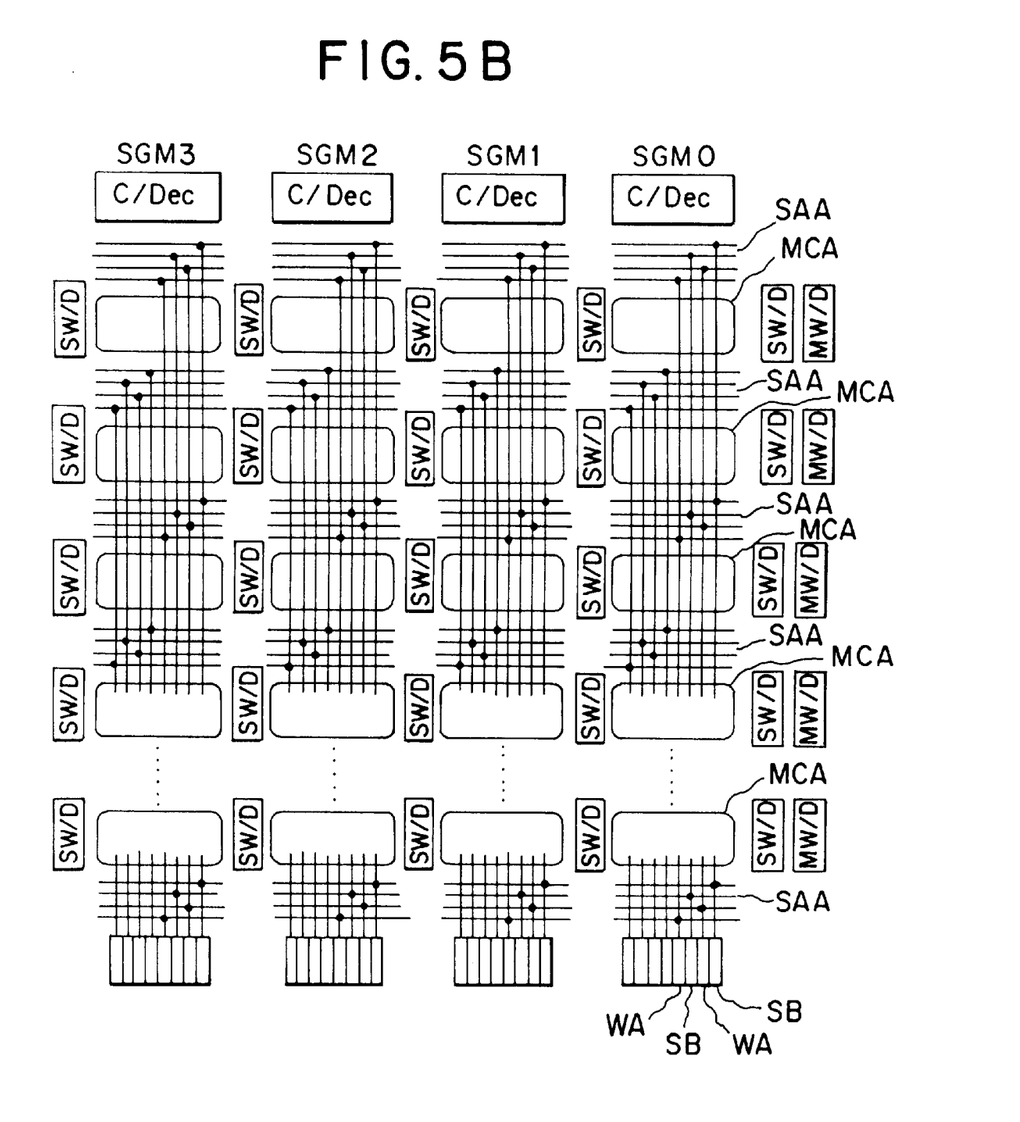

FIG. 5 shows the constitution of the memory device relating to the present embodiment in greater detail. FIG. 5 particularly shows the detailed constitution of the segments comprising the plurality of memory cells. In FIG. 5, eight segments SGM0~7 are shown; a column decoder C/Dec and four groups of sense buffers SB and write amps WA are established in each segment.

Using segment SGM0, for example, a memory cell array MCA comprising a plurality of memory cells and a sense amp array SAA are established alternately and vertically (in columns) within the segment. Two sense amp arrays are established above and below a single memory cell array MCA; the sense amps for increasing the potential of the bitlines in the memory cell array MCA are established within the sense amp array SAA.

A main word decoder MW/D and sub-word decoder SW/D are established for the memory cell array MCA. The main word decoder MW/D selects all the sub-word decoders SW/D in the word direction (horizontally in the figure) within eight segments. From among the selected sub-word decoders SW/D, the sub-word decoder SW/D affiliated with the selected segment drives the wordline, not shown.

The read local data bus rldb#x/z and write local data bus wldb#x/z extending in the word direction (horizontally in the figure) are established on the sense amp array SAA in FIG. 5. Moreover, the x/z in the reference code of the data bus means that a pair of data buses are supplied reverse phase signals. Consequently, the local data buses 14A, 14B in the segment each comprise a pair of read local data bus line pairs. In the figure, read local data buses rldb0x/z, rldb1x/z and write local data buses wldb0x/z, wldb1x/z are established on the even numbered sense amp arrays SAA from the top. Also, read local data buses rldb2x/z, rldb3x/z and write local data buses wldb2x/z, wldb3x/z are established on the odd numbered sense amp arrays SAA. Consequently, the local data buses in the segments comprise four pairs of read local data buses and four pairs of write local data buses.

Read global data buses rgdb#x/z (rgdb0x/z~rgdb7x/z, (The # indicates a numeric character; this is also the case below)), write global data buses wgdb#x/z (wgdb0x/z~wgdb7x/z), extending in the bit direction (vertically in the figure), are established on the memory cell arrays MCA and sense amp arrays SAA of the segments. In other words, the global data bus 16 comprises four pairs of read global data bus line pairs and four pairs of write global data bus line pairs.

These global data buses rgdb#x/z, wgdb#x/z are connected to the buses corresponding to the plurality of local data buses rldb#x/z, wldb#x/z established in each segment. Within a segment, four read global data buses rgdb0x/z~rgdb3x/z are connected to the four sense buffers SB in the segment. Within a segment, four write global data buses wgdb0x/z~wgdb3x/z are connected to the four write amps WA in the segment.

Those sense buffers SB are connected to the read common data bus as shown in FIG. 3; also, the write amps WA are connected to the write common data bus. The read and write common data buses ultimately are connected to the common data output terminals via the prescribed input/output circuit.

Figures 6, 6A:
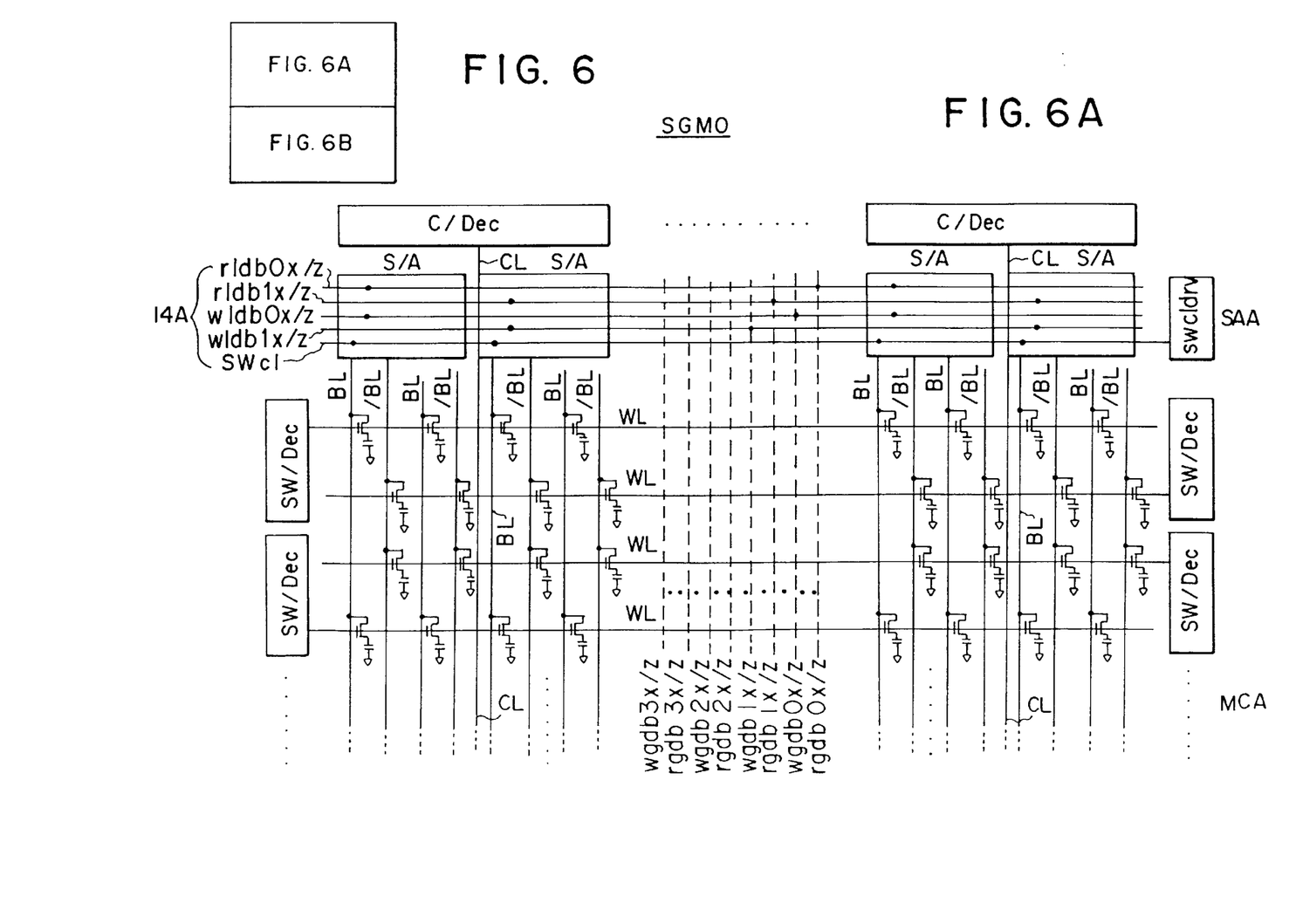
FIG. 6 shows one memory cell array in a segment and the sense amp array on both sides thereof.
Figure 6B:
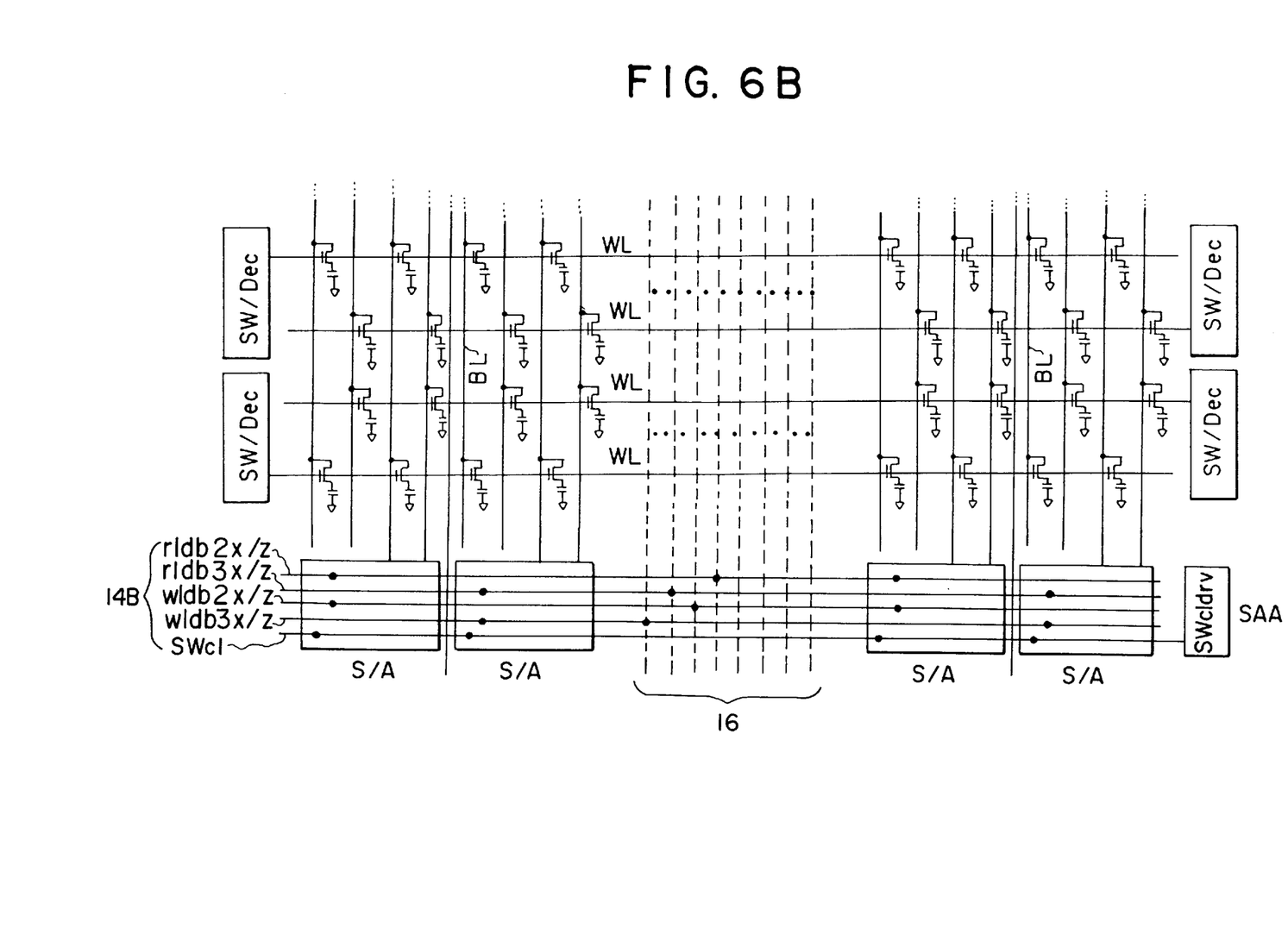

FIG. 6 shows one memory cell array in a segment and the sense amp arrays on both sides thereof. A plurality of wordlines WL driven with the sub-word decoder SW/Dec and a plurality of bitlines BL, /BL connected to the sense amps S/A are established within the memory cell array MCA. A memory cell, comprising one transistor and one capacitor, is established where the wordlines and bitlines intersect.

The column decoder C/Dec established for the segment generates the column selection signal CL; the output of four groups of sense amps S/A, established in groups of two in the column direction, is connected to four groups of read local data buses rldb0x/z~rldb3x/z via column gates, not shown, made to conduct by the column selection signal CL. The four groups of write local data buses wldb0x/z~wldb3x/z are connected to the four groups of sense amps S/A, established in groups of two in the column direction, via a column gate made conductive by the column selection signal CL and a write column selection signal swcl. This write column selection signal swcl is driven by a write column selection signal driver swcldrv.

In FIG. 6, the abovementioned four groups of sense amps S/A are shown on the upper end of the figure; four identical groups of sense amps S/A are shown on the lower end.

In the figure, a local data bus group 14A is established on or, rather, near the sense amp array SAA above the memory cell array MCA; and a local data bus group 14B is established on or, rather, near the sense amp array SAA below the memory cell array MCA. The local data bus group 14A comprises two pairs of read local data buses rldb0x/z, rldb1x/z and two pairs of write local data buses wldb0x/z, wldb1x/z. The lower local data bus group 14B also comprises two pairs of read local data buses rldb2x/z, rldb3x/z and two pairs of write local data buses wldb2x/z, wldb3x/z. The write column selection signals swcl are established along the local data bus groups 14A, 14B.

The four pairs of read local data buses rldb#x/z and write local data buses wldb#x/z, extending in the word direction (horizontally), are connected with the four pairs of read global data buses rgdb#x/z and write global data buses wgdb#x/z, extending in the column direction (vertically), respectively. As noted above, the global data bus group 16 is connected to the sense buffers SB and write amps WA associated with the segment.

Figure 7:
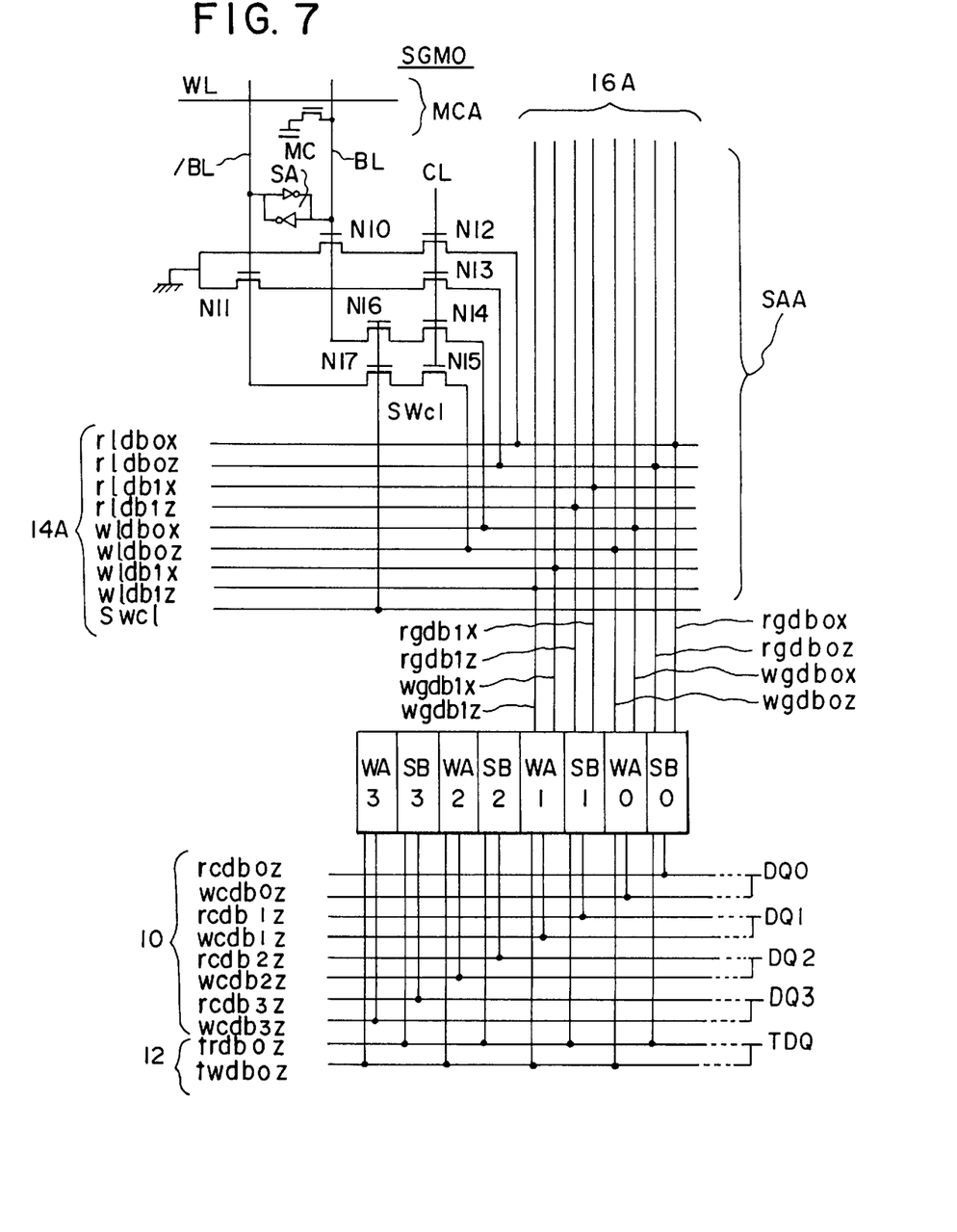
FIG. 7 shows the structure of the local data bus and the global data bus in a segment.

FIG. 7 shows the structure of the local data buses and global data buses in a segment. FIG. 7 shows the structure of the bitline pair BL, /BL, column gate, local data bus group 14A, global data bus group 16A, sense buffers SB, and write amps WA, from the memory cell MC to the common data bus group 10.

Within the memory cell array MCA, the memory cell MC is established at the intersection of the wordline WL and bitline BL. The sense amp SA connected to the bitline pair BL, /BL, the column gate comprising transistors N10~N17, and the local data bus group 14A are established in the sense amp array SAA.

The transistors N10~N13 are read column gates; the transistors N14~N17 are write column gates. During reading, the transistors N12, N13 are made conductive by the High column selection signal CL supplied by the column decoder C/Dec. At that time, either of the transistors N10 and N11 is made conductive by the bitline pair BL, /BL, driven High and Low by the sense amp SA; either one of the read local data buses rldb0x, rldb0z is driven High and the other is driven Low.

At this time, the transistors N14, N15 enter a conductive state due to the column selection signal CL, but the write column selection signal swcl is Low; as a result, the transistors N16, N17 are not conductive and the bitline pair BL, /BL is not connected to the write local data buses wldb0x, wldb0z. Consequently, the write local data buses wldb0x, wldb0x are maintained in a pre-charge level, for example.

The read local data buses rldb0x, rldb0z are connected to the read global data buses rgdb0x, rgdb0z as well; the read data are supplied to the sense buffer SB0 via the global data buses rgdb0x, rgdb0z. The sense buffer SB0 senses the voltage of those read global data buses rgdb0x, rgdb0z and supplies that output to the read common data bus rcdb0z. The read common data bus rcdb0z transmits and outputs that output to a data input/output terminal DQ0 via an output circuit, not shown.

Meanwhile, in a write operation, when write data are supplied to a data input/output terminal DQ0, the write data are supplied to a write amp WA0 via a write common data bus wcdb0z. The write amp WA0 drives the write global data bus line pair wgdb0x/z High and Low according to this write data. At the same time, the write local data bus line pair wldb0x/z connected to the global data bus line pair wgdb0x/z is also driven and becomes High and Low.

In a write operation, at the same time that the column selection signal CL becomes High, the write column selection signal swcl also becomes High and the write local data bus line pair wldb0x/z is connected to the bitline pair BL, /BL via transistors N14~N17. As a result, the write amp WA0 drives the bitline pair via the global data bus line pair and local data bus line pair.

As shown in FIG. 7, the read local data bus line pair and write local data bus line pair are electrical separated by transistors N10, N11. Consequently, it is not necessary to drive the read local data bus and global data bus, in addition to driving the write local data bus and global data bus with the write amp WA.

As clear from FIG. 7, the portion between the sense amp SA and data input/output terminal DQ in the present embodiment has a structure wherein all read data buses and write data buses are separated. Consequently, during read operations directly after the effective read data of the memory cell are output from the data input/output terminal DQ via the sense amp, column gate, local data bus, global data bus, and common data bus, write data can be supplied to the bitline pair via the write common data bus, write global data bus, and write local data bus, which are a separate write path, even if read data remain in the common data bus, for example.

In particular, in the present embodiment, the common data bus closest to the data input/output terminal DQ is divided into the read common data bus and write common data bus; as a result, it becomes possible to supply write data to the write common data bus immediately upon the end of an effective read operation and it is not necessary to provide limitations such as delaying a write operation after reading by one clock. Consequently, write operations following reading can be initiated at the leading edge of the first clock CLK following reading even when the frequency of the synchronizing clock CLK becomes high.

In FIG. 7, only the two pairs each of read and write global data buses 16A (rgdb#x/z, wgdb#x/z) and the local data buses 14A (rldb#x/z, rldb#x/z) are shown. The remaining half of the global data buses and local data buses have the same constitution; the global data buses are connected to the sense buffers SB2, 3 and write amps2, 3. In FIG. 7, the test input/output terminal TDQ is connected to test read and write data buses trdb0z and twdb0z via separate input/output circuits, not shown.

Figure 8:
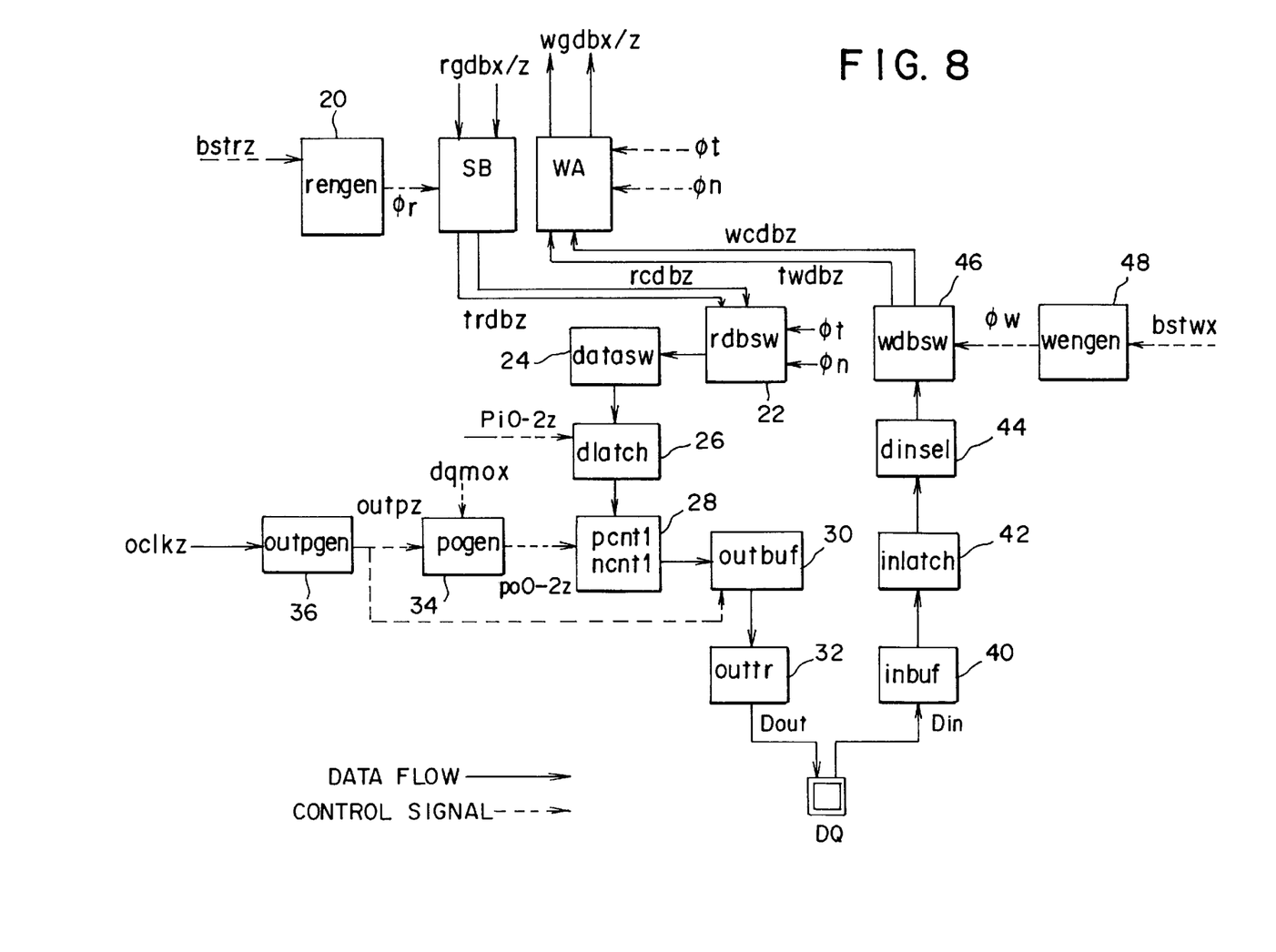
FIG. 8 is a block diagram showing the common data bus and input/output circuit.

FIG. 8 is a block diagram showing the common data bus and input/output circuit. FIG. 8 shows the structure of the output circuit from the read global data bus rgdbx/z to the data output terminal DQ, and the structure of the input circuit from the data input/output terminal DQ to the write global data bus wgdbx/z. In the figure, the solid lines show the flow of data signals; the broken lines show other control signals.

The constitution of the output circuit is explained according to the flow of the read data. In response to the read enable signal $\phi r$ generated by the read enable signal generating circuit 20 in response to the read control signal bstrz, the signal of the read global data bus rgdbx/z is detected by the sense buffer SB. The sense buffer SB outputs read data to the read-dedicated common data bus rcdbz and test read data bus trdbz. The read data bus switching circuit 22 is supplied a normal mode signal $\phi n$ and a test mode signal $\phi t$; in response to the normal mode signal $\phi n$, the switching circuit 22 selects the signal of the read common data bus rcdbz and outputs to the data switching circuit 24. This data switching circuit 24 is a circuit for selecting any of the 1/4 bank circuits shown in FIG. 5; the data switching circuit 24 associated with the selection bank circuit outputs the read data to the data latch circuit 26.

In order to be able to select the read data as timed according to the established CAS latency CL (for example, CL=2 or 3), the data latch circuit 26 responds to three input pointer signals pi0–2z, comprising three different timings, and separately latches the read data of each.

The output control circuit 28, output buffer 30, and output transistor circuit 32 comprise the final stage of the data output circuit. The output transistor circuit 32 is usually constituted with a P channel transistor on the pull up side and an N channel transistor on the pull down side. Consequently, the output control circuit 28 generates a signal for controlling the P channel transistor and N channel transistor in the output transistor circuit 32 according to the read data. Because the output transistor circuit is a circuit connected to an external power source, the output buffer circuit 30 converts the level of the control signal, generated by the output control circuit 28, to the potential of the external power source.

The output control circuit 28 takes up one of the three types of read data within the data latch circuit 26 in response to the output timing signal outpz, generated by the output timing signal generating circuit 36 at the same timing as the clock oclkz for controlling output timing. The output pointer signal generating circuit 34 activates one of the three output pointer signals po0–2z in response to the output timing signal outpz. The corresponding read data latched within the data latch circuit 26 are thereby taken up.

The output pointer signal generating circuit 34 controls the generation of the output pointer signal po0–2z according to the logic of the data mask signal dqm0x. In other words, when the data mask signal dqm0x is provided within the read mode period, output of the read data is prohibited. Specifically, when reading is prohibited by the data mask signal dqm0x, the output pointer signal generating circuit 34 is not caused to generate any output pointer signals; consequently, read data latched by the data latch circuit 26 are not supplied to any output circuit 30, 32.

As shown in FIG. 8, no circuits to which logic, such as the data mask signal dqm0x, is input are installed between the sense buffer SB and the final output circuits 28, 30, 32. Accordingly, the read data detected with the sense buffer SB are output to the data latch circuit 26 without being delayed by the control signal dgm0x. At the final stage the data mask signal dgm0z having active level prohibits the data from outputting via the data output circuits 30, 32 to the data input/output terminal DQ. In the normal operation, the control signals oclkz or outpz control the output timing of the data. This constitution makes it possible to decrease the TCAC, which is the control time from the leading edge of the clock CLK until data are output to the data input/output terminal DQ.

Next, the data input circuit along the flow of write data is explained. The write data Din are supplied to the data input/output terminal DQ in synchronization with the leading edge of the clock CLK. The input buffer 40 takes up this write data and converts the data to the internal power supply level. The converted write data Din are latched by the input latch circuit 42. The input data structure selection circuit 44 is the circuit for selecting the word structure, such as a 4 bit structure, 8 bit structure, or 16 bit structure, for the input data latched by the input latch circuit 42. Then, in response to the write timing signal φw, the write data bus switching circuit 46 supplies the write data to the write-dedicated common data bus wcdbz and test write data bus twdbz. This write timing signal φw is generated by the write timing signal generating circuit 48 in response to the write control signal bstwx.

The portion from the abovementioned data input/output terminal DQ to the write data bus switching circuit 46 corresponds to the data input circuit.

In response to the normal mode signal φn and test mode signal φt, the write amp WA drives the write global data bus wgdbx/z according to either the write-dedicated common data bus wcdbz or the test write data bus twdbz.

Figure 9:
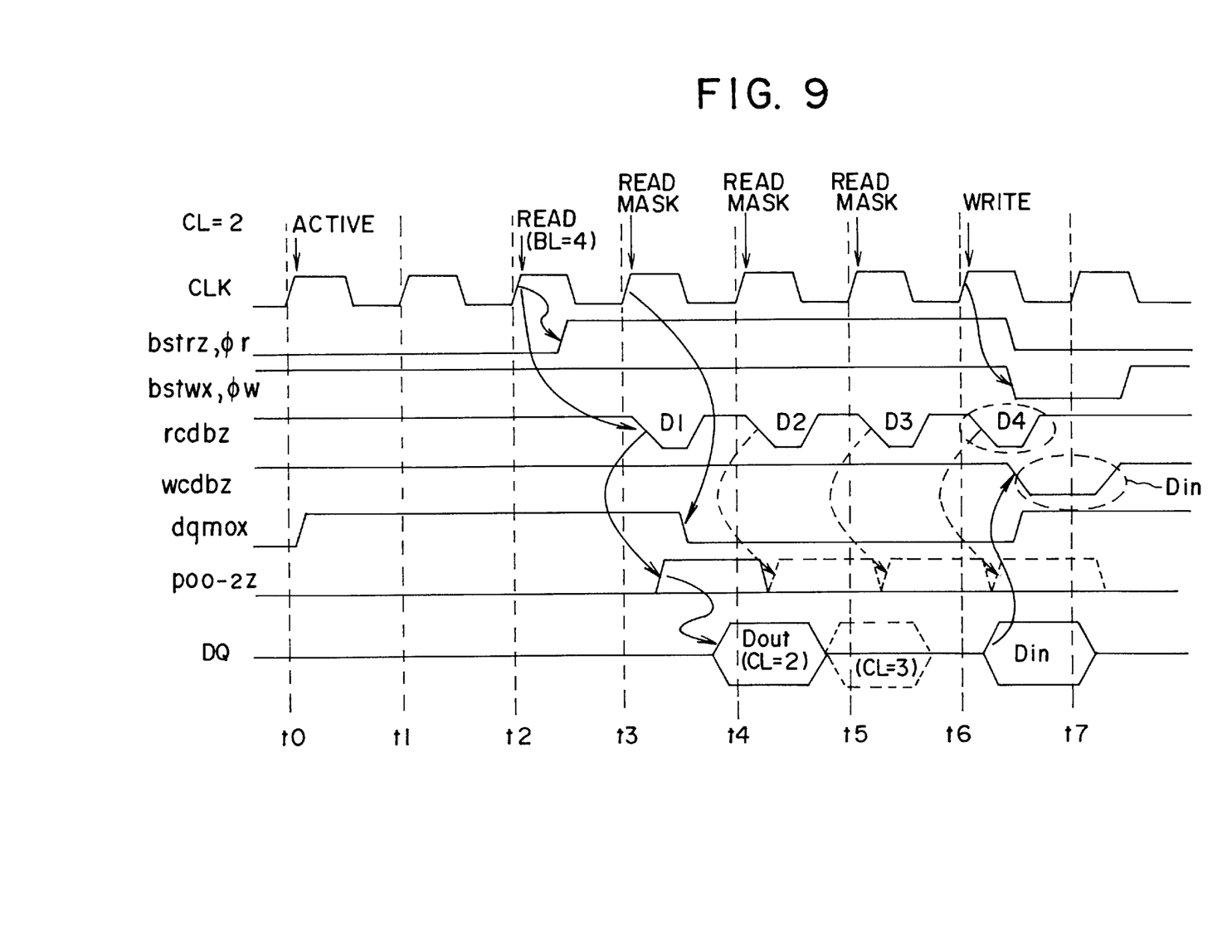
FIG. 9 is an operations timing chart for the input/output circuit in FIG. 8.

FIG. 9 is an operations timing chart for the input/output circuit in FIG. 8. FIG. 9 shows a write operation following burst reading in the case of a CAS latency CL=2 and burst length BL=4. Times t0–t7 show the timing of the leading edge of the synchronizing clock CLK.

At time t0, the active command Active is supplied, the wordline WL shown in FIG. 7 is driven, the data within the memory cell MC are read to the bitline, the sense amp SA is activated, and the voltage the bitline pair is increased.

Next, at time t2, when the read command Read is supplied, the read control signal bstrz and read enable signal φr become active (High) in response thereto. In this read mode, the burst length BL is 4 and the output circuit operates so that the four read data are output successively, synchronized with the clock. In response to this read enable signal φr, the sense buffer SB successively outputs the read data D1, D2, D3, D4 to the read common data bus rcdbz.

The first read datum D1 is provided to the output control circuit 28 in response to the output pointer signals po0–2z and output from the data input/output terminal DQ. Here, the CAS latency CL is set at 2; read data are output to the data input/output terminal DQ from the input time t2 of the initial read command Read to the time t4 following the second clock.

In the example in FIG. 9, a data mask signal Mask is supplied at times t3, t4, and t5 even during the burst read mode. In response to the input of that data mask signal Mask, the internal data mask signal dqm0z becomes the Low, active level; as shown with the broken lines in the figure, the supply of the output pointer signals po0–2z to the output control circuit 28 is prohibited. As a result, the transfer of the second and later read data D2, D3, D4 to the data output circuit is prohibited and the second and later read data are not output to the data input/output terminal DQ.

Then the write command Write is supplied at the next time t6 after time t5 of the final read mode. In response to this write command Write, the write data Din supplied to the data input/output terminal DQ are output to the write-dedicated common data bus wcdbz within the same clock cycle.

At this time, the time when the fourth read datum D4 in the burst read mode is output to the read-dedicated common data bus rcdbz is very close to or overlaps the time when the write data Din in the write mode are output to the write-dedicated common data bus wcdbz. However, in the present embodiment, the common data bus is divided into read-dedicated buses and write-dedicated buses; as a result, the read data D4 and write data Din do not fight and conflict on the common data bus.

In FIG. 9, when the CAS latency CL is set at 3, the initial datum D1 is output to the data input/output terminal DQ at time t5 following the third clock cycle, in response to the read command Read supplied at time t2. Even in such a case, if the write command Write is supplied after the three data mask signals Mask are supplied during burst reading, write data Din can be input at time t7 without read data being present at the data input/output terminal DQ.

Of course, when the CAS latency CL is set at 1 as well, conflict between read data and write data at the data input/ output terminal is avoided in the same way, if the write command Write is provided after the three data mask signals Mask.

As understood from FIG. 9, there are no data conflict problems on the common data bus and there are no limits to the write operation, even if the write command is provided at time t6 immediately after the final read operation at time t5.

Furthermore, the common data bus is divided into read and write buses with a write common data bus established between the read common data buses; this makes it possible to reduce the time required for reading without disrupting the wavelength due to coupling noise on the read common data bus. Accordingly, high speed reading synchronized with a clock, such as burst reading, becomes possible even on the basis of a high speed clock.

The present embodiment can also be applied to the RAM portion of a RAM and logic circuit, for example.

The scope of the present invention is not limited to the abovementioned embodiment and applies to the invention described in the claims and corresponding equivalents.

With the present invention, the timing of write operations following read operations can be sped up and limitations such as delaying the timing of write operations can be eliminated even at higher operation frequencies. Also, the present invention can increase the speed of read operations from the input of the read command until read data are output.

What is claimed is:

1. A memory device, having a plurality of segments each of which includes a plurality of memory cells, comprising:

a sense buffer for inputting read data from said segment and a write amp for supplying write data to said segment, said sense buffer and write amp being established for each of said segments;

a common data bus group including a read common data bus established in common for said sense buffers of said plurality of segments and a write common data bus established in common for said write amps of said plurality of segments; and a data input/output circuit for outputting the read data from said read common data bus and supplying the write data to said write common data bus.

2. The memory device, according to claim 1, wherein in said common data bus group, each of said write common data buses is provided between said read common data buses.

3. The memory device, according to claim 1, wherein in said common data bus group, a plurality of said read common data buses and a plurality of said write common data buses are provided alternately.

4. The memory device, according to any one of the claims 1 through 3, wherein said sense buffer drives said read common data bus in response to a read command; and the write data taken up into said data input/output circuit are supplied to said write common data bus in response to a write command supplied after a prescribed number of data mask signals are supplied in burst reading mode.

5. The memory device, according to any one of the claims 1 through 3, wherein the each segment further includes a segment read data bus connected between the sense buffer and the memory cells and a segment write data bus connected between the write amp and the memory cells.

6. The memory device, according to the claim 5, wherein the segment read data bus comprises a global read data bus connected to the sense buffer and a local read data bus connected to the memory cells, and the segment write data bus comprises a global write data bus connected to the write amp and a local write data bus connected to the memory cells.

7. A memory device, having a plurality of segments each of which includes a plurality of memory cells, comprising:

read data bus lines and write data bus lines, separately established in a path from bitlines connecting to said memory cells to the data input/output terminal;

a sense buffer for transferring read data within said separate read data bus; and a write amp for transferring write data within said separate write data bus.

8. The memory device, according to the claim 7, wherein the read data bus includes a common read data bus between the sense buffer and the data input/output terminal and a segment read data bus between the sense buffer and the bitlines in each segment, the write data bus includes a common write data bus between the write amp and the data input/output terminal and a segment write data bus between the write amp and the bitlines in each segment.

9. The memory device, according to the claim 8, wherein the segment read data bus comprises a global read data bus connected to the sense buffer and a local read data bus connected to the memory cells, and the segment write data bus comprises a global write data bus connected to the write amp and a local write data bus connected to the memory cells.

* * * * *